United States Patent [19]

Shinozaki et al.

[11] 4,175,971

[45] Nov. 27, 1979

[54] LIGHT-SENSITIVE PHOTOPOLYMERIZABLE COMPOSITION

[75] Inventors: Fumiaki Shinozaki; Yasuo Washigawa; Tomoaki Ikeda; Sho Nakao; Syunichi Kondoh, all of Asaka, Japan

[73] Assignee: Fuji Photo Film Co., Ltd., Minami-Ashigara, Japan

[21] Appl. No.: 832,864

[22] Filed: Sep. 13, 1977

[30] Foreign Application Priority Data

Sep. 14, 1976 [JP] Japan ............................... 51-110151

[51] Int. Cl.[2] ........................... G03C 1/68; C08F 2/46

[52] U.S. Cl. ............................... 430/287; 204/159.18; 204/159.23; 430/919; 430/923; 430/288

[58] Field of Search ......................... 96/115 R, 115 P; 204/159.18, 159.23

[56] References Cited

U.S. PATENT DOCUMENTS

| | | | |
|---|---|---|---|
| Re. 28,789 | 4/1976 | Chang | 96/86 P |
| 3,552,973 | 1/1971 | Fishman | 96/90 R |
| 4,023,973 | 5/1977 | Imaizuma et al. | 96/115 R |
| 4,055,430 | 10/1977 | Hasegawa et al. | 196/115 P |

*Primary Examiner*—Jack P. Brammer

*Attorney, Agent, or Firm*—Sughrue, Rothwell, Mion, Zinn and Macpeak

[57] ABSTRACT

A light-sensitive composition comprising addition polymerizable ethylenically unsaturated double bond-containing compounds and a photopolymerization initiator comprising (1) at least one compound selected from the group consisting of benzanthrone, substituted benzanthrones (the substituents of which include halogen atoms, alkyl groups having 1 to 5 carbon atoms and alkoxy groups having 1 to 5 carbon atoms), 1,2-benzanthraquinone and substituted benzanthraquinones (substituents of which include halogen atoms, alkyl groups having 1 to 5 carbon atoms and alkoxy groups having 1 to 5 carbon atoms) and (2) at least one compound selected from the group consisting of 4,4′-di-substituted amino-benzophenones represented by the following general formula (a), p-substituted amino-benzaldehyde derivatives represented by the following general formula (b), 2-(p-substituted amino-phenyl)-1,3-dioxolanes represented by the following general formula (c), 4,4′-bis(substituted amino)-N-benzylideneanilines represented by the following general formula (d) and 2-[4-(substituted amino)cinnamoyl]naphthalenes represented by the following general formula (e):

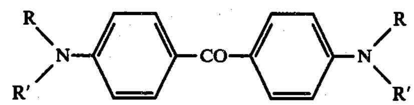

(a)

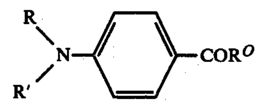

(b)

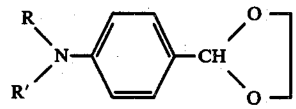

(c)

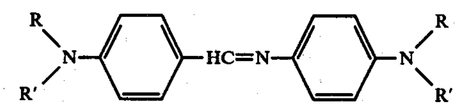

(d)

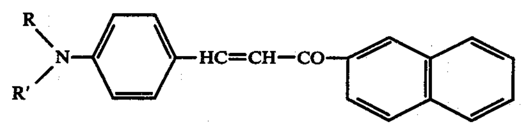

(e)

where R and R′, which may be the same or different, each represents a methyl group or an ethyl group, and $R^0$ represents a hydrogen atom, a hydroxy group, a —$CR^1R^2R^3$ group, where $R^1$, $R^2$ and $R^3$, which may be the same or different, each represents a hydrogen atom or an alkyl group having 1 to 3 carbon atoms, or an —$OR^4$ group, where $R^4$ represents an alkyl group having 1 to 5 carbon atoms.

6 Claims, No Drawings

LIGHT-SENSITIVE PHOTOPOLYMERIZABLE COMPOSITION

BACKGROUND OF THE INVENTION

1. Field of the Invention

This invention relates to light-sensitive compositions and, more particularly, it is concerned with photopolymerization initiators which can be used in light-sensitive compositions comprising polymerizable ethylenically unsaturated double bond-containing compounds.

2. Description of the Prior Art

The photopolymerization of ethylenically unsaturated double bond-containing compounds can be initiated by irradiation of these compounds with ultraviolet light and, particularly, with ultraviolet light in the shorter wavelength region. However, a polymerization initiated only by irradiation with light such as ultraviolet light, no matter how strong the applied radiation is, proceeds much more slowly, compared with the case where polymerization takes place in the presence of a certain type of catalyst capable of chemically producing free radicals. In addition, an extremely long time of exposure to ultraviolet light is required for sufficient polymerization of the monomers used, or a light source of the kind which can exert an extremely strong action upon the monomers to be polymerized is necessitated for sufficient and rapid polymerization. Therefore, many attempts have been made to discover materials which can accelerate the polymerization which takes place due to irradiation with light. A number of compounds have consequently been discovered as photosensitizers or photopolymerization initiators which can be used to increase the speed of photopolymerization which results from irradiation with electromagnetic waves. These compounds possess the function that they have the ability to absorb light and produce free radicals capable of initiating the polymerization. However, conventionally known photopolymerization initiators have several practical problems to be solved, though they can initiate the polymerization of certain monomers, for example, ethylenically unsaturated compounds, which is the object of the present invention. For instance, since the photopolymerization initiation capability of most known photopolymerization initiators is suppressed by interaction of oxygen therewith, the photopolymerization reaction must be carried out in the absence of oxygen. However, the various methods which have been proposed for the removal of oxygen have problems in that there are many difficulties when they are put into practice, and much expense is involved.

Benzanthrone, 1,2-benzanthraquinone and the derivatives thereof are already known as photopolymerization initiators as described in, for example, *Insha Kogaku*, Shinichi Kikuchi and Eiichi Inoue, Ed., Kyoritsu Shuppan, Tokyo for benzanthrone and *Journal of Applied Polymer Science,* 2 308 (1959), Jaromir Kosar, *Light-Sensitive Systems,* published by John Wiley and Sons Inc., New York (1965) and *Journal of the Society of Photographic Science and Technology of Japan,* 28 7 (1965) for 1,2-benzanthraquinone. However, these compounds influence to a lesser extent the polymerization of ethylenically unsaturated compounds dealt with in the present invention, although their sensitizing function in a cross-linking reaction of resins containing light-sensitive groups such as cinnamoyl group is exhibited.

SUMMARY OF THE INVENTION

Accordingly, an object of the present invention is to solve the above-described problems resulting from the use of conventional photopolymerization initiators such as benzanthrone and the like in photopolymerization of ethylenically unsaturated double bond-containing compounds.

This object is attained with a light-sensitive composition containing polymerizable ethylenically unsaturated double bond-containing compounds and, as a photopolymerization initiator, the combination of (1) at least one compound selected from the group consisting of benzanthrone, substituted benzanthrones (the substituents of which include halogen atoms (such as F, Cl, Br and I), alkyl groups having 1 to 5 carbon atoms (such as methyl, ethyl, propyl, isopropyl, n-butyl, isobutyl, sec-butyl, t-butyl, pentyl and isoamyl), and alkoxy groups having 1 to 5 carbon atoms (such as methoxy, ethoxy, propoxy, butoxy, pentyloxy, isopropoxy and isoamyloxy)), 1,2-benzanthraquinone and substituted benzanthraquinones (the substituents of which include halogen atoms (such as F, Cl, Br and I), alkyl groups having 1 to 5 carbon atoms (such as methyl, ethyl, propyl, isopropyl, n-butyl, isobutyl, sec-butyl, t-butyl, pentyl and isoamyl), and alkoxy groups having 1 to 5 carbon atoms (such as methoxy, ethoxy, propoxy, butoxy, pentyloxy, isopropoxy and isoamyloxy)) and (2) at least one compound selected from the group consisting of the compounds represented by the following general formulas (a), (b), (c), (d) and (e):

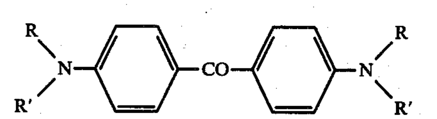
(a)

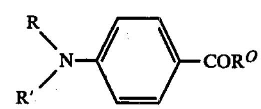
(b)

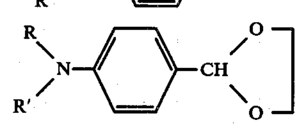
(c)

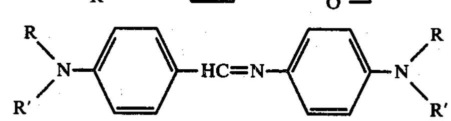
(d)

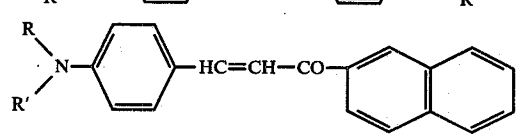
(e)

wherein R and R′, which may be the same or different, each represents a methyl group or an ethyl group, and $R^0$ represents a hydrogen atom, a hydroxy group, a $—CR^1R^2R^3$ group, wherein $R^1$, $R^2$ and $R^3$, which may be the same or different, each represents a hydrogen atom or an alkyl group having 1 to 3 carbon atoms (such as methyl, ethyl, propyl and isopropyl) or an $—OR^4$ group, wherein $R^4$ represents an alkyl group having 1 to 5 carbon atoms (such as methyl, ethyl, propyl, isopropyl, n-butyl, isobutyl, sec-butyl, t-butyl, pentyl and isoamyl).

DETAILED DESCRIPTION OF THE INVENTION

The "polymerizable ethylenically unsaturated double bond-containing compounds" used in this invention are addition polymerizable and examples of polymerizable ethylenically unsaturated double bond-containing compounds which may be employed in the present invention include a wide variety of monomers and oligomers (e.g., having a molecular weight of about 1,000 or less). In general, examples include esters of ethylenically unsaturated double bond-containing organic acids such as acrylic acid, methacrylic acid, itaconic acid and the like with aliphatic polyhydric alcohols (e.g., having 1 to 20, preferably 1 to 10, carbon atoms and containing 1 to 8, preferably 1 to 6, hydroxy groups) such as ethylene glycol, triethylene glycol, tetraethylene glycol, neopentyl glycol, 1,10-decane-diol, trimethylolethane, trimethylolpropane, butane diol, pentaerythritol, dipentaerythritol, tripentaerythritol and other poly-(e.g., tetra- to deca-)pentaerythritols, sorbitol, d-mannitol, esters of diols of ethylenically unsaturated fatty acids (e.g., undecylenic acid, oleic acid, etc.) and chemically modified substances thereof. A suitable range of the number of carbon atoms in the esters of the ethylenically unsaturated double bond-containing organic acids for use in this invention is 3 to about 20, preferably 3 to 6, carbon atoms. Specific examples of these compounds include trimethylolpropane triacrylate, trimethylolethane triacrylate, trimethylolpropane trimethacrylate, trimethylolethane trimethacrylate, tetramethylene glycol dimethacrylate, ethylene glycol diacrylate, ethylene glycol dimethacrylate, triethylene glycol dimethacrylate, tetraethylene glycol dimethacrylate, tetraethylene glycol diacrylate, pentaerythritol diacrylate, pentaerythritol triacrylate, pentaerythritol tetraacrylate, dipentaerythritol diacrylate, dipentaerythritol triacrylate, dipentaerythritol tetraacrylate, dipentaerythritol pentaacrylate, dipentaerythritol hexaacrylate, tripentaerythritol octaacrylate, pentaerythritol dimethacrylate, pentaerythritol trimethacrylate, dipentaerythritol dimethacrylate, dipentaerythritol trimethacrylate, dipentaerythritol tetramethacrylate, tripentaerythritol octamethacrylate, pentaerythritol diitaconate, dipentaerythritol triitaconate, dipentaerythritol pentaitaconate, dipentaerythritol hexaitaconate, ethylene glycol dimethacrylate, 1,3-butane-diol diacrylate, 1,3-butane-diol dimethacrylate, 1,4-butane-diol, diitaconate, sorbitol triacrylate, sorbitol tetraacrylate, sorbitol tetramethacrylate, sorbitol pentaacrylate, sorbitol hexaacrylate and mixtures thereof and the oligomers thereof.

The photopolymerization initiators present in the light-sensitive compositions of the present invention comprise the combination of component (1) and component (2).

Component (1) comprises at least one compound selected from the group consisting of benzanthrone, substituted benzanthrones, 1,2-benzanthraquinone and substituted 1,2-benzanthraquinones. Specific examples of substituted benzanthrones which can be used include 1-methoxybenzanthrone, 2-methoxybenzanthrone, 3-methoxybenzanthrone, 5-methoxybenzanthrone, 6-ethoxybenzanthrone, 8-ethoxybenzanthrone, 3-methylbenzanthrone, 3-chlorobenzanthrone, 11-chlorobenzanthrone, 3-chloro-2-methoxybenzanthrone, 9-bromo-2-methoxybenzanthrone and so on. Specific examples of substituted 1,2-benzanthraquinones which can be used include 6-chloro-1,2-benzanthraquinone, 6-methyl-1,2-benzanthraquinone, 6-methoxy-1,2-benzanthraquinone and so on.

On the other hand, component (2) comprises at least one compound selected from the group consisting of compounds having the general formulas (a) to (e) described above. Specific examples of compounds represented by the general formula (a) include (i) N,N,N',N'-tetramethyl-4,4'-diaminobenzophenone (Michler's ketone), (ii) N,N,N',N'-tetraethyl-4,4'-diaminobenzophenone, (iii) N,N'-dimethyl-N,N'-diethyl-4,4'-diaminobenzophenone and so on. Specific examples of compounds represented by the general formula (b) include (iv) N-methyl-N-ethyl-p-aminobenzaldehyde, (v) N,N-dimethyl-p-aminobenzaldehyde, (vi) N,N-diethyl-p-aminobenzaldehyde, (vii) N,N-dimethyl-p-aminobenzoic acid, (viii) methyl N,N-dimethyl-p-aminobenzoate and so on. Specific examples of compounds represented by the general formula (c) include (ix) 2-p-(dimethylamino)-phenyl-1,3-dioxolane, (x) 2-p-(diethylamino)phenyl-1,3-dioxolane, (xi) 2-p-(methylethylamino)phenyl-1,3-dioxolane and so on. Specific examples of compounds represented by the general formula (d) include (xii) 4,4'-bis(-dimethylamino)-N-benzylideneaniline, (xiii) 4,4'-bis(diethyl)-N-benzylideneaniline, (xiv) 4,4'-bis(methylethylamino)-N-benzylideneaniline and so on. Specific examples of compounds represented by the general formula (e) include (xv) 2-[4-(dimethylamino)cinnamoyl]naphthalene, (xvi) 2-[4-(diethylamino)cinnamoyl]naphthalene, (xvii) 2-[4-(methylethylamino)cinnamoyl]naphthalene and so on.

The above-described specific examples are merely exemplary of substituted compounds which can be used in and are included in the scope of the present invention.

Suitable methods of preparation of the compounds represented by the general formula (a) are described in, for example, H. E. Fierz-David and L. Blangey (translated by P. W. Vittum), *Fundamental Process of Dye Chemistry,* p. 139, published by Interscience Publishers Inc., 1949.

As to the compounds represented by the general formula (b), U.S. Pat. No. 3,552,973 discloses that they can be used as a photopolymerization initiator in combination with a hexaarylbiimidazole (p-aminophenyl ketone) and U.S. Reissue Pat. No. 28,789 discloses that they can be used as a photopolymerization initiator in combination with a cis-α-dicarbonyl compound.

Suitable methods of preparation of the compounds represented by the general formula (c) are described in, for example, *J. Am. Chem. Soc.,* 70, pp. 2827–2828 (1948).

Suitable methods of preparation of the compounds represented by the general formula (d) are described in, for example, Helmut Krauch and Werner Kumz, *Organic Name Reactions,* p. 96 (1964), published by John Wiley and Sons Inc., New York.

Suitable methods of preparation of the compounds represented by the general formula (e) are described in, for example, P. Pfeiffer and O. Angen, *Justus Liebigs Annalen der Chemie,* 44, pp. 228–265 (1925); B. N. Dashkevich and I. V. Smedanka, *Ukrain. Khim. Zhur.,* 21, pp. 619–624 (1955); and I. V. Smedanka, *Nauch. Zapiski. Uzhgrod. Univ.,* 18, pp. 15–19 (1957).

At least one compound selected from each of the groups of compounds listed for components (1) and (2) is employed as a photopolymerization initiator present in the light-sensitive composition of the present invention. A suitable weight ratio of component (1) to component (2) which can be used to achieve the effect desired in the present invention ranges from about 10:1 to about 1:100, preferably about 5:1 to about 1:20, most preferably about 2:1 to about 1:5. A suitable amount of the photopolymerization initiator to the photopolymerizable compound (ethylenically unsaturated double bond-containing compound) can range from about 0.1% to about 20%, preferably about 1% to about 15%, by weight. A suitable amount of the photopolymerization initiator to the photopolymerizable composition (excluding solvent(s)) can range from about 0.05% to about 10%, preferably about 0.5% to about 7%, by weight.

Any of the compounds described above for component (2) can be used to achieve the effect desired in the present invention. Of these compounds, those compounds represented by the formulas (a) and (b) have, in particular, the advantage of a lack of selectivity toward the polymerizable compounds with which they are to be used. This will become apparent from the results obtained in the Example hereinafter described. Namely, although trimethylolpropane triacrylate and trimethylolpropane trimethacrylate are employed as the polymerizable compound in the Example hereinafter described, each of the compounds of the general formula (a) or (b) can be used to achieve the effect desired in the present invention to a satisfactory extent with any of the ethylenically unsaturated double bond-containing polymerizable compounds when used as the component (2) of the photopolymerization initiator used in the present invention.

Although the light-sensitive compositions of the present invention contain basically two elements, that is, a polymerizable compound and a photopolymerization initiator comprising the above-described components (1) and (2), various kinds of addenda may be added thereto depending upon the purpose of the end-use of the light-sensitive composition, the techniques to be applied to, and other various conditions. Examples of these addenda include binders, thermal polymerization inhibitors, plasticizers, solvents, colorants, surface modifying agents and so on. A suitable amount of these addenda (other than solvent(s)) ranges from about 0.1% to about 40%, preferably 0.5% to 20%, by weight, based on the weight of the photopolymerizable composition of this invention. The addition of these addenda to light-sensitive compositions is, in general, a well known means in handling compositions of this kind.

Specific examples of suitable binders include gelatin, polyvinyl alcohol, polyvinyl butyral, polyacrylic acid, polymethacrylic acid, polyethylene oxide, ethylcellulose, polyesters, polyvinyl chloride, polystyrene, polyacrylic acid esters, polymethacrylic acid esters, polyvinyl acetal, polyamides, polyacrylonitrile, polyethylene, halogenated polyolefins, chlorinated rubber ethylcellulose, cellulose acetate, cellulose nitrate and other homopolymers; and copolymers prepared from various kinds of vinyl compounds such as a vinyl chloride-vinyl acetate copolymer, a styrene-butadiene copolymer, etc. A suitable binder can be selected from these examples described above depending upon the compatibility with other components incorporated in the composition, especially with the polymerizable compound and the procedures to be carried out, for example, the developing process to be employed in case of an image-forming material. The amount of the thus-selected binder can be experimentally determined by taking into account the above-described conditions.

Specific examples of suitable thermal polymerization inhibitors include hydroquinone, hydroquinone monomethyl ether, catechol, β-naphthol, mono-t-butylhydroquinone, pyrogallol and so on. A suitable amount of the thermopolymerization inhibitor which can be used ranges from about 0.01% to about 5%, preferably 0.1% to 3%, by weight, based on the weight of the photopolymerizable composition (excluding solvent(s)) of this invention.

Specific examples of suitable plasticizers include dioctyl phthalate, dibutyl phthalate, butyl phthalyl butyl glycolate, tricresyl phosphate, polyester series plasticizers and chlorinated paraffins. A suitable amount of the plasticizer can range from about 0.1% to about 20%, preferably 1% to 10%, by weight based on the weight of the photopolymerizable composition (excluding solvent(s)) of this invention.

Specific examples of fillers include glass fiber, powdered silica, baryta and calcium carbonate. Suitable examples of solvents include acetone, methyl ethyl ketone, methyl Cellosolve, methyl Cellosolve acetate, 1,2-dichloroethane, butyl alcohol and so on. A suitable amount of the solvent which can be employed in the photopolymerizable composition of this invention ranges from about 50% to about 1,000%, preferably 70% to 500%, by weight.

Optionally, dyes or/and pigments may be added to the compositions of the present invention for the purpose of coloration to a desired hue. Attention, however, should be called to the fact that certain dyes or pigments exert a desensitization effect upon the composition. A suitable amount of the dyes which can be used ranges from about 0.01% to about 10%, preferably 0.1% to 3%, by weight, based on the weight of the photopolymerizable composition (excluding solvent(s)) of this invention. A suitable amount of the pigments which can be used ranges from about 0.05% to about 20%, preferably 0.1% to 3%, by weight, based on the weight of the photopolymerizable composition (excluding solvent(s)) of this invention.

In addition, a finely divided titanium oxide or silica powder may be added with the intention of matting the surface of the layer of the composition. Moreover, higher fatty acids having more than 17 carbon atoms, such as behenic acid, may be added to the light-sensitive composition upon exposure to light in order to reduce to an even lesser extent the influence of oxygen thereon. Since these techniques are already known, detailed descriptions thereof do not need to be made here.

In general, the components to be used in the photopolymerizable composition are simply mixed with a solvent(s) in a homogenizer or mixer with stirring whereby a solution of the composition is prepared. Solvents which can be used in preparing the photopolymerizable composition of this invention include ketones such as acetone, methyl ethyl ketone, methyl isobutyl ketone, cyclohexanone, diisobutyl ketone, etc., esters such as ethyl acetate, butyl acetate, amyl acetate, methyl formate, ethyl propionate, dimethyl phthalate, ethyl benzoate, etc., aromatic hydrocarbons such as toluene, xylene, benzene, ethylbenzene, etc., halogenated hydrocarbons such as carbon tetrachloride, trichloroethylene, chloroform, 1,1,1-trichloroethane, 1,2-dichloroethane, monochlorobenzene, chloronaphthalene, etc., ethers such as tetrahydrofuran, diethyl ether, ethylene glycol monoethyl ether acetate, ethylene glycol monomethyl ether, etc., dimethylformamide, dimethyl sulfoxide, etc., and a mixture thereof.

The thus-obtained photopolymerizable composition undergoes with ease a photopolymerization upon irradiation with actinic radiation having wavelengths ranging from about 1,800 Å to about 5,000 Å in the presence or absence of air.

Examples of light sources capable of generating the actinic radiation described above include a carbon arc lamp, a mercury vapor lamp, an ultraviolet fluorescent lamp, a tungsten lamp, an incandescent lamp, a xenon lamp, an argon glow lamp, a lamp for photographic illumination and sunlight. The time period for exposure which is suitable to achieve polymerization is dependent on the strength of light source and the distance between the light source and the photopolymerizable composition layer. In general, a suitable period ranges from about 1 second to about 5 minutes, preferably about 3 seconds to about 60 seconds.

The photopolymerizable compositions prepared in accordance with embodiments of the present invention undergo photochemically a polymerization upon irradiation with the above-described actinic radiation to result in the production of photo-hardened materials.

The photopolymerizable compositions of the present invention possess the advantages in that the sensitivity to the photopolymerization of ethylenically unsaturated compounds is markedly high, the characteristics of high sensitivity can be maintained for a relatively long period of time since variation in the composition with the lapse of time is small, and the compositions are only slightly influenced by oxygen. Therefore, they can be effectively employed in a wide variety of arts by making use of known methods, for example, the formation of photographic images, the make-up of a printing plate, the preparations of a resist for masking, a photo-hardening ink, photo-hardening coating materials and name plates, an under-coating for various kinds of materials such as glass, synthetic resins, paper, metal, stone materials, wood, natural polymeric materials (e.g., cellulose) and so on, the production of printed materials, the preparation of printed circuits, the preparation of laminates, the preparation of impregnated materials, the manufacture of synthetic resin moldings and so on. A composite support of the support materials disclosed hereinabove, which is prepared by providing a thin layer on, for example, a synthetic resin coated paper, a synthetic resin (polymer) sheet, etc., can also be used.

The present invention will now be illustrated in greater detail by reference to the following Example. Unless otherwise indicated herein, all parts, percents, ratios and the like are by weight.

EXAMPLE

An alloy having the composition of $Al_5Fe_1$ was placed in a boat as an evaporating source disposed in a vacuum evaporation apparatus, and polyethylene terephthalate film 100 micron thick was positioned about 30 cm away from the boat in a shape of an arc in the above-described apparatus. The pressure in the apparatus was maintained at $5\times10^{-5}$ Torr. The thickness of the evaporated thin layer was monitored using a monitor connected to the apparatus and, evaporation was continued until the layer had a thickness of 600 Å. Thus, a thin layer of Al-Fe alloy was formed on the polyethylene terephthalate film. On the resulting alloy layer, each of light-sensitive compositions set forth below in which each sample was different was coated by means of a rotary coating machine at a coverage of 3 microns in dry thickness, and dried at 100° C. for 2 minutes.

| Composition | |
|---|---|
| Ethylenically Unsaturated Double Bond-Containing Compound* | 0.85 g |
| Photopolymerization Initiator* | 0.07 g |
| Binder (benzyl methacrylate-methacrylic acid copolymer; copolymerization molar ratio = 73:27; $[\eta]^{30}$ = 0.12) | 1.0 g |
| Binder (chlorinated polyethylene) | 0.2 g |
| Behenic Acid | 0.02 g |
| Solvent (1,2-dichloroethane) | 3 g |

*The specific compounds used are listed in the following table.

The thus-prepared image-forming materials were placed at a distance of 50 cm from the light source, and wedge-wise exposed to light for 20 seconds. Therein, a super high pressure mercury lamp "Jet Light 2000" (made by O. R. C. Seisakusho) having a power of 2 kw was used as a light source. Exposed materials were development-processed with a developer having the composition hereinafter described at a temperature of 31° C. for 30 seconds to result in the removal of the unexposed areas of the layer of the light-sensitive composition by dissolution thereof and the etching of uncovered alloy, at almost the same time. Therein, the wedge used was "Step Guide for PS" (Step $\Delta D \approx 0.15$) (made by Fuji Photo Film Co., Ltd.).

| Formulation of Developing Solution | |
|---|---|
| Sodium Hydroxide | 4 g |
| Sodium Chlorite | 10 g |
| Trisodium Phosphate | 10 g |
| Sodium Aluminate | 3 g |
| Surface Active Agent ("Monogen Y-100") (sodium salt of a higher alcohol sulfuric acid ester manufactured by Dai-ichi Kogyo Seiyaku Co., Ltd.) | 10 g |
| Water to make | 1 l |

"Sensitivity" of each of the samples was represented by the minimum step number at the solid part of the wedge-image obtained. The results for each of the samples are shown in the following table.

TABLE

| | Sensitivity Photopolymerization Initiator | | | Sensitivity Compound Containing Ethylenically Unsaturated Double Bond | |
|---|---|---|---|---|---|
| Run No. | Component (1) | Component (2) | Mixing Ratio by Weight | Trimethylolpropane Triacrylate | Trimethylolpropane Trimethacrylate |
| Comparison | | | | | |
| 1 | Benzanthrone | — | — | 0 | 0 |
| 2 | — | Compound (i) | — | 3.5 | 0.5 |
| 3 | Benzanthrone | Triethanolamine | 1:2 | 0 | 0 |
| 4 | Benzanthrone | Thio Michler's Ketone | 1:2 | 0 | 0 |
| 5 | Benzanthrone | 2,4,7-Trinitro- | 1:2 | 0 | 0 |

TABLE-continued

| | Sensitivity Photopolymerization Initiator | | | Sensitivity Compound Containing Ethylenically Unsaturated Double Bond | |
|---|---|---|---|---|---|
| Run No. | Component (1) | Component (2) | Mixing Ratio by Weight | Trimethylolpropane Triacrylate | Trimethylolpropane Trimethacrylate |
| | | fluorene | | | |
| 6 | Benzanthrone | Methyl Red | 1:2 | 0 | 0 |
| 7 | Benzanthrone | 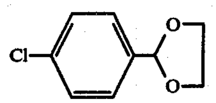 | 1:2 | 0 | 0 |
| 8 | Anthrone | Compound (v) | 1:2 | 0 | 0 |
| Invention | | | | | |
| 9 | Benzanthrone | Compound (i) | 1:2 | 5 | 8.5 |
| 10 | Benzanthrone | Compound (v) | 1:2 | 6.5 | 9.5 |
| 11 | Benzanthrone | Compound (viii) | 1:2 | 4 | 6.5 |
| 12 | 4-Chlorobenz-anthrone | Compound (i) | 1:2 | 6.5 | 9 |
| 13 | 4-Chlorobenz-anthrone | Compound (v) | 1:2 | 6.5 | 8 |
| 14 | 1,2-Benz-anthraquinone | Compound (i) | 1:2 | 4.5 | 7 |
| 15 | 1,2-Benz-anthraquinone | Compound (v) | 1:2 | 7.5 | 8.5 |
| 16 | 6-Chloro-1,2-benzanthra-quinone | Compound (i) | 1:2 | 5 | 8 |
| 17 | Benzanthrone | Compound (ix) | 1:2 | 1.5 | 9.5 |
| 18 | Benzanthrone | Compound (xii) | 1:2 | 1 | 6.5 |
| 19 | Benzanthrone | Compound (xv) | 1:2 | 1 | 6.5 |
| 20 | 4-Chlorobenz-anthrone | Compound (vii) | 1:2 | 3 | 4.5 |
| 21 | 4-Chlorobenz-anthrone | Compound (xii) | 1:2 | 2.5 | 5.5 |
| 22 | 1,2-Benz-anthraquinone | Compound (ix) | 1:2 | 1 | 8.5 |

It can be seen from the results in Table above that the specific combination of photopolymerization initiators in accordance with the present invention exhibit a remarkable effect upon the photopolymerization of ethylenically unsaturated double bond-containing compounds, although the individual use of such an initiator does not possess the sensitivity regarding a photopolymerization of this kind. Therefore, it can be understood that the light-sensitive compositions of the present invention are useful as image-forming materials in image formation techniques.

In addition, combinations possessing a wedge step number of 1 to 3 can be also employed practically by prolonging the exposure time or/and by intensifying the intensity of the light source to be used.

While the invention has been described in detail and with reference to specific embodiments thereof, it will be apparent to one skilled in the art that various changes and modifications can be made therein without departing from the spirit and scope thereof.

What is claimed is:

1. A light-sensitive composition consisting essentially of at least one ester of an ethylenically unsaturated double bond-containing organic acid and an aliphatic polyhydric alcohol, said ester having a molecular weight of about 1000 or less, and a photopolymerization initiator, said photopolymerization initiator consisting essentially of a combination of the components (1) benzanthrone, a benzanthrone substituted with one or more of halogen atoms, alkyl groups having 1 to 5 carbon atoms or alkoxy groups having 1 to 5 carbon atoms, a 1,2-benzanthraquinone or a benzanthraquinone substituted with one or more of halogen atoms, alkyl groups having 1 to 5 carbon atoms or alkoxy groups having 1 to 5 carbon atoms, or a mixture thereof and (2) a compound represented by the formula (a):

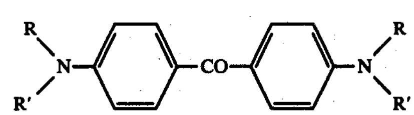

(a)

wherein R and R′, which may be the same or different, each represents a methyl group or an ethyl group, wherein the weight ratio of component (1) to component (2) of said photopolymerization initiator ranges from about 10:1 to about 1:100 and the amount of said photopolymerization initiator ranges from about 0.1 to about 20% by weight to the weight of the ester.

2. The light-sensitive composition of claim 1, wherein said ester is an oligomer of said ester.

3. The light-sensitive composition of claim 1 wherein said ester is trimethylolpropane triacrylate, trimethylolpropane trimethacrylate, trimethylolethane triacrylate, trimethylolethane trimethacrylate, pentaerythritol diacrylate, pentaerythritol triacrylate, pentaerythritol tetraacrylate, pentaerythritol dimethacrylate, pentaerythritol trimethacrylate, dipentaerythritol diacrylate, dipentaerythritol triacrylate, dipentaerythritol tetraacrylate, dipentaerythritol pentaacrylate, dipentaerythritol hexaacrylate, dipentaerythritol dimethacrylate, dipentaerythritol trimethacrylate, dipentaerythritol tetramethacrylate, ethylene glycol diacrylate, ethylene glycol dimethacrylate, or a mixture thereof.

4. The light-sensitive composition of claim 1 wherein said component (1) of said photopolymerization initiator is benzanthrone, 1-methoxybenzanthrone, 2-methoxybenzanthrone, 3-methoxybenzanthrone, 5-methoxybenzanthrone, 6-ethoxybenzanthrone, 8-ethoxybenzanthrone, 3-methylbenzanthrone, 3-chlorobenzanthrone, 11-chlorobenzanthrone, 3-chloro-2-methoxybenzanthrone, 9-bromo-2-methoxybenzanthrone, 1,2-benzanthraquinone, 6-chloro-1,2-benzanthraquinone, 6-methyl-1,2-benzanthraquinone, or 6-methoxy-1,2-benzanthraquinone, and said component (2) of said photopolymerization initiator is N,N,N',N'-tetramethyl-4,4'-diaminobenzophenone, N,N,N',N'-tetraethyl-4,4'-diaminobenzophenone or N,N'-dimethyl-N,N'-diethyl-4,4'-diaminobenzophenone.

5. The light-sensitive composition of claim 1, wherein said component (1) is benzanthrone and said component (2) is N,N,N',N'-tetramethyl-4,4'-diaminobenzophenone.

6. The light-sensitive composition of claim 1, wherein said component (1) is benzanthrone.

* * * * *